United States Patent
Thalmann et al.

(10) Patent No.: US 7,308,622 B2
(45) Date of Patent: Dec. 11, 2007

(54) INTEGRATED MEMORY AND METHOD FOR TESTING THE MEMORY

(75) Inventors: Erwin Thalmann, Müchen (DE); Sven Boldt, Müchen (DE)

(73) Assignee: Infineon Technologies AG, Muenchen (DE)

( * ) Notice: Subject to any disclaimer, the term of this patent is extended or adjusted under 35 U.S.C. 154(b) by 1042 days.

(21) Appl. No.: 10/619,157

(22) Filed: Jul. 14, 2003

(65) Prior Publication Data
US 2004/0153910 A1    Aug. 5, 2004

(30) Foreign Application Priority Data
Jul. 12, 2002 (DE) .............................. 102 31 680

(51) Int. Cl.
*G01R 31/28* (2006.01)
(52) U.S. Cl. ..................... 714/718; 714/724
(58) Field of Classification Search ............... None
See application file for complete search history.

(56) References Cited

U.S. PATENT DOCUMENTS

| 5,640,509 A | 6/1997 | Balmer et al. |
| 5,745,403 A * | 4/1998 | Taylor .................. 365/145 |
| 2001/0030888 A1* | 10/2001 | Chang .............. 365/185.03 |
| 2003/0126529 A1* | 7/2003 | Cho ..................... 714/720 |

\* cited by examiner

*Primary Examiner*—Guy Lamarre
*Assistant Examiner*—Steven D Radosevich
(74) *Attorney, Agent, or Firm*—Laurence A. Greenberg; Werner H. Stemer; Ralph E. Locher

(57) ABSTRACT

An integrated memory includes command terminals for receiving command signals in a normal operation and in a test operation of the memory, and also a signal terminal for receiving a further signal, which differs from the command signals. Registers store data patterns or data topologies for use in the test operation of the memory. A register decoder circuit serves for the selection of the registers, it being possible for inputs of the register decoder circuit to be connected to the command terminals and to the signal terminal for the purpose of selection of the registers in the test operation. The invention makes it possible, for the test operation, to address an increased number of registers without driving an additional external terminal pin. A method for testing the memory is also provided.

18 Claims, 2 Drawing Sheets

| CMD (Function) | CS | RAS | CAS | WE | CKE | Address | Register |
|---|---|---|---|---|---|---|---|
| Deselect (NOP) | H | X | X | X | X | X | X |
| No Operation (NOP) | L | H | H | H | H | X | X |
| Active (Selection of bank and activation of line) | L | L | H | H | H | Bank/line | X |
| RDA (Selection of bank & column, YA register, start read burst) | L | L | L | H | L | Bank/column | YA |
| RDB (Selection of bank & column, YB register, start read burst) | L | L | H | H | L | Bank/column | YB |
| RDC (Selection of bank & column, YC register, start read burst) | L | H | L | H | L | Bank/column | YC |
| RDD (Selection of bank & column, YD register, start read burst) | L | H | H | H | L | Bank/column | YD |
| WRA (Selection of bank & column, YA register, start write burst) | L | L | L | L | L | Bank/column | YA |
| WRB (Selection of bank & column, YB register, start write burst) | L | L | H | L | L | Bank/column | YB |
| WRC (Selection of bank & column, YC register, start write burst) | L | H | L | L | L | Bank/column | YC |
| WRD (Selection of bank & column, YD register, start write burst) | L | H | H | L | L | Bank/column | YD |
| Burst Terminate | L | H | H | H | H | X | X |
| Precharge | L | L | H | L | H | Code | X |
| Auto Refresh or Self Refresh | L | L | L | H | H | X | X |
| Mode Register Set | L | L | L | L | H | Code | X |
| Write | L | H | L | L | H | Bank/column | X |
| Read | L | H | L | H | H | Bank/column | X |
| Write with Auto Precharge | L | H | L | L | H | Bank/column | X |

FIG. 2

INTEGRATED MEMORY AND METHOD FOR TESTING THE MEMORY

BACKGROUND OF THE INVENTION

Field of the Invention

The present invention relates to an integrated memory having a plurality of registers for storing data patterns or data topologies for use in a test operation of the memory and are selected in the test operation for reading out the data patterns or data topologies from the registers and method for testing the memory.

In the course of the fabrication of integrated memories, the latter are, generally, subjected to at least one functional test in which the functionality of the tested integrated memory is checked. In such a case, the integrated memory or a sub-circuit of the memory is tested by an external test device, for example, which generates test information and carries out or controls the functional test.

By way of example, the memory is subjected to a memory cell test for the purpose of checking memory cells with regard to their functionality. During such a test operation for checking the memory cells, test data are written to each individual memory cell and are read out again. For such a purpose, use is generally made of specific, defined data patterns or data topologies that are written to the memory cells and are read out again. A comparison between the data written in and read out again provides information about whether or not a functional defect of the tested memory cells is present.

With the ongoing development of integrated memories and rising storage capacities associated therewith, the problem generally arises that the test times per memory increase. A principal aim in the fabrication of integrated memories is to fabricate memories of a specific size more cost-efficiently, i.e., to minimize the fabrication costs per memory chip. A considerable part of the fabrication costs is allotted to the test costs that are associated with the memory tests and that generally rise proportionally with the test time required per wafer or per memory chip. Therefore, it is of major interest to minimize the test time for testing memory chips.

The test time is generally determined by the number of tests used per memory chip, the parallelism, i.e., the number of chips that are tested simultaneously, and also by the test speed. However, an upper limit is imposed on increasing the parallelism and test speed, in particular, on account of limitations in the hardware used in test systems and on account of the limited number of driver pins of test systems, and the upper limit is virtually always fully utilized in the case of present-day memory sizes.

In a test configuration that is preferably employed in this regard, the memory chip to be tested itself generates all the test data used during the functional test. In such a test configuration, the read-in of the data patterns or data topologies into the memory and the comparison of the test data read out with the data patterns read in are carried out by the memory chip itself. A test configuration of this type requires a comparatively low transfer power of the test system and a comparatively small number of terminal pins required so that it is possible to achieve a relatively high parallelism during the test operation. In such a case, the test system only receives an item of so-called pass/fail information from the memory chip.

The data patterns or data topologies used in a test configuration of this type are stored in internal registers of the memory. In the test operation of the memory, these registers are selected for reading out the data patterns or data topologies from the registers. In this case, it has generally been customary, hitherto, to address two registers thus provided through an external terminal pin. The so-called clock enable pin CKE, for example, is used for such a purpose. On account of the increasing complexity of memories and of the test operation, it is desirable to provide a plurality of registers for storing data patterns or data topologies on the memory. Further external terminal pins would be necessary for addressing additional registers, but this is generally undesirable on account of the above-mentioned considerations for reducing the test costs.

SUMMARY OF THE INVENTION

It is accordingly an object of the invention to provide an integrated memory and method for testing the memory that overcome the hereinafore-mentioned disadvantages of the heretofore-known devices and methods of this general type and in which an increased number of registers that are provided for storing data patterns or data topologies for use in a test operation of the memory can be addressed by an external test system without using an additional external terminal pin.

With the foregoing and other objects in view, there is provided, in accordance with the invention, an integrated memory, including command terminals for receiving command signals in a normal operation of the memory and in a test operation of the memory, a signal terminal for receiving a further signal different from the command signals, registers storing at least one of data patterns and data topologies used in the test operation of the memory, and a register decoder circuit connected to the registers for selecting the registers, the register decoder circuit having inputs connected to the command terminals and to the signal terminal for selecting the registers in the test operation, the register decoder circuit selecting the registers in the test operation for reading out the at least one of data patterns and data topologies from the registers.

With the objects of the invention in view, there is also provided a method for testing an integrated memory, including the steps of receiving command signals with command terminals in a normal operation of the memory and in a test operation of the memory, receiving a further signal with a signal terminal, the further signal being different from the command signals, storing at least one of data patterns and data topologies in a plurality of registers for use in the test operation of the memory, connecting inputs of the register decoder circuit to the command terminals and to the signal terminal for selecting the registers in the test operation, and selecting the registers with the register decoder circuit in the test operation and reading out the at least one of data patterns and data topologies from the registers.

The integrated memory according to the invention has command terminals for receiving command signals that are received both in a normal operation of the memory and in a test operation of the memory for controlling the operation of the memory. In a normal operation of the memory, a memory controller provides the command signals, for example, and by a connected test system in a test operation of the memory. Furthermore, the memory has a signal terminal for receiving a further signal, which differs from the command signals. The signal terminal receives a clock activation signal (so-called clock enable signal), for example, in a normal operation of the memory. The memory, furthermore, has a plurality of registers that are provided for storing data patterns or data topologies for use in the test operation of the memory. The registers are selected in the test operation for reading out the data patterns or data topologies from the registers. Furthermore, provision is made of a register decoder circuit for the selection of these registers, it being possible for inputs of the register decoder circuit to be connected to the command terminals and to the signal terminal for the purpose of selection of the registers in the test operation.

The invention, advantageously, makes it possible that, by only one signal terminal, for example, for receiving a clock enable signal, in combination with the command terminals, which have to be connected to the test system anyway for controlling the test operation, additional commands for the test operation can be generated and, in conjunction therewith, it is possible to address an increased number of registers for the test operation. The situation where an additional external address pin has to be connected to the test system for the purpose of addressing the registers is, thus, avoided advantageously.

In an advantageous embodiment of the invention, the memory has a command decoder, it being possible for inputs of the command decoder to be connected to the command terminals for receiving the command signals and to the signal terminal. The command decoder generates a command both in the test operation of the memory and in the normal operation thereof. In the event of a first state of the signal present at the signal terminal, a command is generated depending on the command signals for the test operation. In the event of a second state of the signal present at the signal terminal, a command for the normal operation is generated depending on the command signals. In the test operation, the register, which is associated with the respective command and in which the data pattern respectively required is stored, is selected by the register decoder circuit.

In accordance with another feature of the invention, the signal terminal is connected to one of the inputs of the register decoder circuit and one of the inputs of the command decoder in a manner allowing changeover by a test mode signal, dependent upon a test mode signal.

In accordance with a further feature of the invention, the signal terminal receives a clock activation signal in the normal operation of the memory.

In accordance with a concomitant feature of the invention, the command terminals are four command terminals, the registers are four registers, and the inputs of the register decoder circuit are connected the four command terminals and to the signal terminal for selecting the four registers in the test operation.

Other features that are considered as characteristic for the invention are set forth in the appended claims.

Although the invention is illustrated and described herein as embodied in an integrated memory and method for testing the memory, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is an exemplary embodiment of a command truth table with the associated register addressing according to the invention.

DESCRIPTION OF THE PREFERRED EMBODIMENTS

Figure 1:
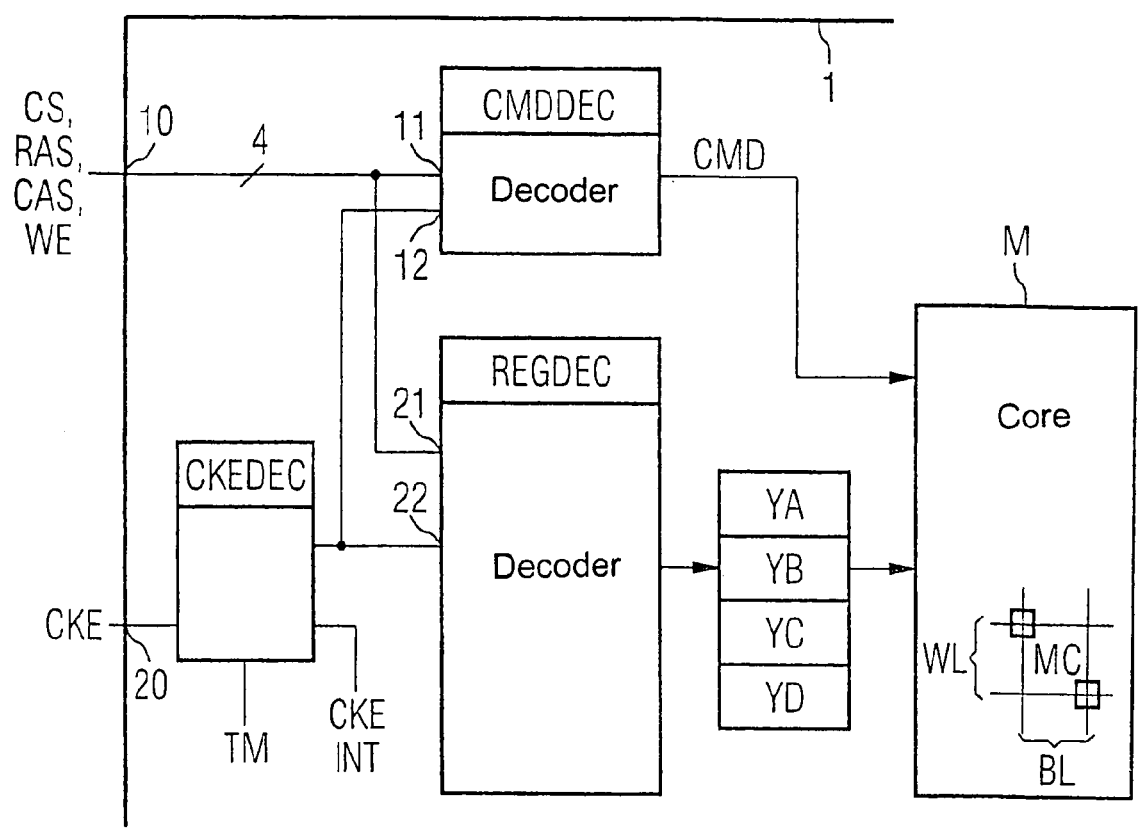
FIG. 1 is a block circuit diagram shows an advantageous embodiment of an integrated memory according to the invention.

Referring now to the figures of the drawings in detail and first, particularly to FIG. 1 thereof, there is shown a memory 1 having command terminals 10 for external connection, at which terminals command signals CS, RAS, CAS, and WE are received in a normal operation and in a test operation of the memory. These command signals are provided by a memory controller, for example, in the normal operation and by a connected test system in the test operation of the memory. Furthermore, the memory 1 has a signal terminal 20 for receiving a clock activation signal (clock enable signal) CKE used in the normal operation of the memory. Furthermore, four registers YA, YB, YC, YD are provided in the present exemplary embodiment, which registers are provided for storing data patterns or data topologies that are used in the test operation of the memory for carrying out a functional test of memory cells. A register decoder circuit REGDEC serves for the selection of the registers YA to YD. In this case, inputs 21 and 22 of the register decoder circuit REGDEC are connected to the command terminals 10 and, respectively, to the signal terminal 20 for the purpose of selection of the registers in the test operation.

Furthermore, the memory has a command decoder CMDDEC, whose inputs 11 and 12 can be connected to the command terminals 10 for receiving the command signals and, respectively, to the signal terminal 20. In this case, the signal terminal 20 is connected to the inputs 12 and 22 of the command decoder and of the register decoder circuit, respectively, in a manner that allows changeover by the decoder circuit CKEDEC by the test mode signal TM. For the case where the signal terminal 20 is used in the test operation, the internal terminal CKEINT is put at "high" by the decoder circuit CKEDEC. The signal terminal 20 can, thus, be used in combination with the four command terminals 10 for generating, in particular, eight additional commands. The four independent registers YA to YD can, thus, be addressed for writing and reading the data patterns in the test operation without this necessitating, for instance, an additional external terminal pin.

In the case of the memory 1 in accordance with FIG. 1, memory cells MC disposed in the memory core M along word lines WL and bit lines BL are tested with regard to their functionality in the test operation. For such a purpose, the data patterns stored in the registers YA to YD, under the control of the internal command signals CMD of the command decoder CMDDEC, are read into the memory core M and test data read out are compared with desired data.

An exemplary command truth table with the associated register addressing is illustrated in the table according to FIG. 2. In this case, the command deselect (NOP) means that the memory chip is not addressed externally. The command "no operation (NOP)" represents a non-allocated command. By the command "active", a selected memory bank is selected and the word line to be addressed is activated. This action is carried out in particular at the beginning of the memory access. By the commands "RDA" to "RDD", in the test operation, the memory banks that are respectively to be addressed are selected and so are the corresponding bit lines (columns) for reading out data signals. Likewise, the associated register YA to YD for reading out the corresponding data pattern is addressed and a read burst is started. The commands "WRA" to "WRD" are commands analogous thereto with regard to a write burst. The respective burst access is ended by the command "burst terminate". Bit lines are precharged by the command "precharge". The command "autorefresh or self-refresh" serves for carrying out a so-called refresh operation for refreshing the content of the memory cells. By the "mode register set" command, the so-called mode register of the memory is set, in particular, the so-called CAS latency is programmed. The commands "write" and "read" represent a write and read command, respectively.

The commands described are generated partly in a normal operation of the memory (CKE="H") and partly in the test operation of the memory (CKE="L"). In this case, then, the command decoder generates internal commands CMD for the test operation of the memory in the event of the state of the signal CKE="L", depending on the command signals CS, RAS, CAS, WE. In the event of a state of the signal CKE="H", the command decoder generates internal commands CMD for the normal operation of the memory depending on the command signals. In this case, in the test operation, the register decoder circuit REGDEC selects the register YA to YD associated with the respective command, and the internal terminal CKEINT is put at "high" by the decoder circuit CKEDEC.

We claim:

1. An integrated memory, comprising:
   command terminals for receiving command signals in a normal operation of the memory and in a test operation of the memory;
   a signal terminal for receiving a further signal different from the command signals;
   registers storing at least one of data patterns and data topologies used in the test operation of the memory; and
   a register decoder circuit connected to said registers for selecting said registers, said register decoder circuit having inputs connected to said command terminals and to said signal terminal for selecting said registers in the test operation, said register decoder circuit selecting said registers in the test operation for reading out the at least one of data patterns and data topologies from said registers.

2. The integrated memory according to claim 1, further comprising:
   a command decoder having inputs connected to said command terminals for receiving the command signals and connected to
   the signal terminal for receiving the further signal, the further signal having a first state and a second state;
   said command decoder generating a command for the test operation of the memory when the first state of the further signal is present at said signal terminal dependent upon the command signals;
   said command decoder generating a command for the normal operation of the memory when the second state of the further signal present at said signal terminal depending upon the command signals; and
   said register decoder circuit selecting a respective one of said registers associated with a respective command in the test operation.

3. The integrated memory according to claim 2, wherein said signal terminal is connected to one of said inputs of said register decoder circuit and one of said inputs of said command decoder in a manner allowing changeover by a test mode signal.

4. The integrated memory according to claim 2, wherein said signal terminal is connected to one of said inputs of said register decoder circuit and one of said inputs of said command decoder and changes over between said one input of said register decoder circuit and said one input of said command decoder dependent upon a test mode signal.

5. The integrated memory according to claim 1, further comprising:
   a command decoder having inputs connected to said command terminals for receiving the command signals and connected to the signal terminal for receiving the further signal, the further signal having a first state and a second state;
   said command decoder generating a command for the test operation of the memory when the first state of the further signal is present at said signal terminal;
   said command decoder generating a command for the normal operation of the memory when the second state of the further signal present at said signal terminal; and
   said register decoder circuit selecting a respective one of said registers associated with a respective command in the test operation.

6. The integrated memory according to claim 5, wherein said signal terminal is connected to one of said inputs of said register decoder circuit and one of said inputs of said command decoder in a manner allowing changeover by a test mode signal.

7. The integrated memory according to claim 5, wherein said signal terminal is connected to one of said inputs of said register decoder circuit and one of said inputs of said command decoder and changes over between said one input of said register decoder circuit and said one input of said command decoder dependent upon a test mode signal.

8. The integrated memory according to claim 1, wherein said signal terminal receives a clock activation signal in the normal operation of the memory.

9. The integrated memory according to claim 1, wherein:
   said command terminals are four command terminals;
   said registers are four registers; and
   said inputs of said register decoder circuit are connected said four command terminals and to said signal terminal for selecting said four registers in the test operation.

10. A method for testing an integrated memory, which comprises:
    receiving command signals with command terminals in a normal operation of the memory and in a test operation of the memory;
    receiving a further signal with a signal terminal, the further signal being different from the command signals;
    storing at least one of data patterns and data topologies in a plurality of registers for use in the test operation of the memory;
    connecting inputs of the register decoder circuit to the command terminals and to the signal terminal for selecting the registers in the test operation; and
    selecting the registers with the register decoder circuit in the test operation and reading out the at least one of data patterns and data topologies from the registers.

11. The method for testing an integrated memory according to claim 10, which further comprises:

connecting inputs of a command decoder:
  to the command terminals for receiving the command signals; and
  to the signal terminal;
generating a command with the command decoder for the test operation of the memory when a first state of the further signal is present at the signal terminal;
generating a command with the command decoder for the normal operation of the memory when a second state of the further signal present at the signal terminal;
selecting a register associated with a respective command with the register decoder circuit in the test operation.

12. The method for testing an integrated memory according to claim 10, which further comprises:
connecting inputs of a command decoder:
  to the command terminals for receiving the command signals; and
  to the signal terminal;
generating a command with the command decoder for the test operation of the memory when a first state of the further signal is present at the signal terminal dependent upon the command signals;
generating a command with the command decoder for the normal operation of the memory when a second state of the further signal present at the signal terminal dependent upon the command signals;
selecting a register associated with a respective command with the register decoder circuit in the test operation.

13. The integrated memory according to claim 12, which further comprises connecting the signal terminal to one of the inputs of the register decoder circuit and to one of the inputs of the of the command decoder in a manner that allows changeover by a test mode signal.

14. The integrated memory according to claim 13, which further comprises connecting the signal terminal to one of the inputs of the register decoder circuit and to one of the inputs of the of the command decoder in a manner that allows changeover by a test mode signal.

15. The integrated memory according to claim 13, which further comprises changing over a connection of the signal terminal from one of the inputs of the register decoder circuit to one of the inputs of the of the command decoder dependent upon a test mode signal.

16. The integrated memory according to claim 12, which further comprises changing over a connection of the signal terminal from one of the inputs of the register decoder circuit to one of the inputs of the of the command decoder dependent upon a test mode signal.

17. The method for testing an integrated memory according to claim 10, which further comprises receiving a clock activation signal with the signal terminal in a normal operation of the memory.

18. The method for testing an integrated memory according to claim 10, which further comprises:
providing four command terminals and four registers; and
connecting the inputs of the register decoder circuit to the four command terminals and to the signal terminal for selecting the registers in the test operation.

* * * * *